(12) United States Patent
Manohar et al.

(10) Patent No.: US 7,982,502 B2
(45) Date of Patent: Jul. 19, 2011

(54) ASYNCHRONOUS CIRCUIT REPRESENTATION OF SYNCHRONOUS CIRCUIT WITH ASYNCHRONOUS INPUTS

(75) Inventors: Rajit Manohar, Ithaca, NY (US); Gael Paul, Aix-en-Provence (FR); Marcel Van der Goot, Pasadena, CA (US); Raymond Nijssen, San Jose, CA (US); Christopher LaFrieda, Brooklyn, NY (US); Clinton W. Kelly, San Jose, CA (US); Virantha Ekanayake, San Jose, CA (US)

(73) Assignee: Achronix Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/559,573

(22) Filed: Sep. 15, 2009

(65) Prior Publication Data

US 2011/0062991 A1     Mar. 17, 2011

(51) Int. Cl.
*H03K 19/00* (2006.01)
(52) U.S. Cl. ............................. 326/93; 326/94; 716/108
(58) Field of Classification Search .................... 326/93, 326/94; 716/3, 6, 17, 103, 108, 110
See application file for complete search history.

(56) References Cited

U.S. PATENT DOCUMENTS

| 7,584,449 B2 * | 9/2009 | Beerel et al. ................ 716/18 |
| 7,739,628 B2 * | 6/2010 | Manohar et al. ............. 716/3 |

* cited by examiner

*Primary Examiner* — James Cho
(74) *Attorney, Agent, or Firm* — Schwegman, Lundberg & Woessner, P.A.

(57) ABSTRACT

A synchronous circuit design is converted to an asynchronous circuit by converting synchronous circuit logic to an asynchronous circuit logic, and converting one or more asynchronous inputs at a circuit boundary to an asynchronous input to the converted asynchronous circuit logic, such that the converted asynchronous input is operable to generate a token upon observing a change in state on the asynchronous input. One or more asynchronous outputs at a circuit boundary is converted to an asynchronous output from the converted asynchronous circuit logic, such that the converted asynchronous output is operable to output updated data as soon as changed data is received from the converted asynchronous circuit logic in the asynchronous output.

12 Claims, 2 Drawing Sheets

“Systems and Methods for Performing Automated Conversion of Representations of Synchronous Circuit Designs To and From Representations of Asynchronous Circuit Designs”, pending as U.S. Patent Application no. US2007/0256038. But, significant challenges remain, including how to handle various inputs, outputs, and event signals in converting synchronous and asynchronous circuits.

ASYNCHRONOUS CIRCUIT REPRESENTATION OF SYNCHRONOUS CIRCUIT WITH ASYNCHRONOUS INPUTS

FIELD OF THE INVENTION

The invention relates generally to conversion between synchronous and asynchronous circuit models, and more specifically in one embodiment to asynchronous circuit representation of synchronous circuits with asynchronous inputs.

BACKGROUND

Design of large or complex electronic circuits such as the integrated circuits found in computers, consumer electronics devices, and other such electronic devices is almost universally done using computerized design software. The design software enables the designer to represent various components such as logic gates, registers, and switches using elements representing these functions in the design software, reducing the need for the designer to work with each individual transistor or other element that makes up these standard logic elements.

Hardware Description Languages (HDLs) such as VHDL (Very High Speed Integrated Circuit HDL) provide not only design and layout functionality, but often can simulate operation of a circuit as well. Clocked logic circuits having clocks that define when each element such as a register or latch reads and evaluates input signals can be simulated by stepping through time using discrete clock cycles and tracking the flow of data between elements and operation of the interconnected logic elements at each clock cycle, providing a way to test and optimize designs before building the actual circuitry.

Such clocked, or synchronous circuits, are the building blocks upon which many digital electronic devices are constructed. But, factors such as clock management and skew, power consumption, speed limited by an element's slowest possible function, and other challenges with synchronous circuit design have renewed an interest in asynchronous circuits, which can operate more efficiently in many applications.

Asynchronous circuits do not operate based in the time domain, or on fixed clock timing, but operate in the event domain and are triggered by observation of events. When updated input data is received in an asynchronous digital logic circuit element, the receiving element can update its state based on the input without waiting for a clock. More complex asynchronous logic elements are further able to receive a control signal requesting an action be performed, and send a confirmation that the action is complete. This enables event signals to be passed between asynchronous circuit elements, in addition to the logic data upon which the elements operate.

Asynchronous circuits can also be used to implement circuits originally designed using synchronous circuit elements, by conversion of synchronous to asynchronous elements such as is described in greater detail in

SUMMARY

One example embodiment of the invention comprises converting a synchronous circuit design to an asynchronous circuit by converting synchronous circuit logic to an asynchronous circuit logic, and converting one or more asynchronous inputs at a circuit boundary to an asynchronous input to the converted asynchronous circuit logic, such that the converted asynchronous input is operable to generate a token upon observing a change in state on the asynchronous input. In a further example, one or more asynchronous outputs at a circuit boundary is converted to an asynchronous output from the converted asynchronous circuit logic, such that the converted asynchronous output is operable to output updated data as soon as changed data is received from the converted asynchronous circuit logic in the asynchronous output.

DETAILED DESCRIPTION

Figure 1:
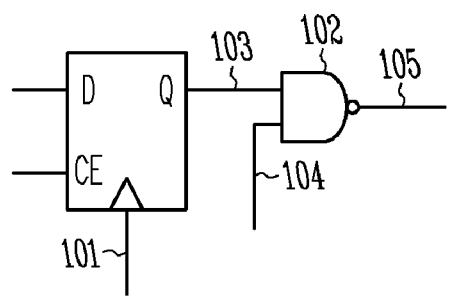
FIG. 1 shows an example circuit having synchronous and asynchronous inputs, consistent with an example embodiment of the invention.

In the following detailed description of example embodiments of the invention, reference is made to specific examples by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit the invention as a whole, and any reference to the invention, its elements, operation, and application do not limit the invention as a whole but serve only to define these example embodiments. The following detailed description does not, therefore, limit the scope of the invention, which is defined only by the appended claims.

Synchronous digital logic circuit designs are traditionally represented using a variety of hardware description languages, higher level description languages, netlists, and schematics. These representations are synchronous representations in that they define the functionality of the circuits in the presence of a clock signal or with a master timing signal used to synchronize operations.

But, asynchronous circuitry that is able to complete operations and pass on results as soon as complete have a variety of advantages in certain applications over synchronous circuitry, including factors such as clock management and skew, power consumption, and ability to take advantage of varying function speeds. A clock distributed across a large circuit operating at high speed will not reach all parts of the circuit at the same time, and so clock skew or phase must be managed in high-performance synchronous circuits to ensure that all parts of the circuit are operating in lock-step as designed. Power consumption is affected by the need to distribute a clock throughout the entire circuit every cycle, as well as the need to constantly drive clock buffers, latches, and combinational logic even when no useful work is being performed. Synchronous circuit elements are also constrained in that a synchronous circuit must wait the longest possible time a logic unit could take to produce a result, whether or not a result is produced more quickly in a given operation.

To utilize an asynchronous architecture to implement a circuit originally laid out as a synchronous circuit, the synchronous representation must be translated into an asynchronous representation. To accomplish this goal, there are two fundamental approaches. First, redesign the circuit using an asynchronous representation, or second, convert the existing synchronous representation into an asynchronous representation.

Redesigning the circuit as in the first approach is time intensive and involves re-implementing an entire design for execution in an asynchronous architecture. This is an approach that is not acceptable to designers as it is costly in terms of time and requires that designers learn a completely new way to represent circuit designs.

The second approach of converting the synchronous circuit to an asynchronous circuit is therefore many times preferred as it does not require that the designer have any knowledge of asynchronous circuit architecture.

Some synchronous representations also contain parts of the design that are in fact asynchronous. While methods for translating a fully synchronous design into an asynchronous design have been discussed elsewhere, such as in "Systems and Methods for Performing Automated Conversion of Representations of Synchronous Circuit Designs To and From Representations of Asynchronous Circuit Designs", pending as U.S. Patent Application no. US2007/0256038, the method described there cannot readily handle a synchronous system that contains asynchronous inputs. Therefore, there is no previous solution that translates a design that contains synchronous components with asynchronous inputs.

A method for translation of a synchronous design having asynchronous inputs into a fully asynchronous design, while preserving the illusion of synchrony on the boundary is therefore provided here, as demonstrated by the examples below. The method in various embodiments can be applied to a complete synchronous circuit, or to part of a synchronous circuit thereby enabling it to handle complex synchronous designs having clock gating, multiple clock domains, or other advanced features.

One example embodiment of the invention comprises converting a synchronous circuit design to an asynchronous circuit by converting synchronous circuit logic to an asynchronous circuit logic, and converting one or more asynchronous inputs at a circuit boundary to an asynchronous input to the converted asynchronous circuit logic, such that the converted asynchronous input is operable to generate a token upon observing a change in state on the asynchronous input. In a further example, one or more asynchronous outputs at a circuit boundary is converted to an asynchronous output from the converted asynchronous circuit logic, such that the converted asynchronous output is operable to output updated data as soon as changed data is received from the converted asynchronous circuit logic in the asynchronous output.

In converting a synchronous circuit to an asynchronous circuit, the inputs include a circuit description such as a synchronous circuit netlist, with additional auxiliary information that is normally provided for synthesis. This information includes the set of clocks and their frequencies (in the case of one clock signal, the frequency is not necessarily required), the set of multi-cycle paths (if any), and any constraints on input and output signals with respect to the appropriate clocks. In addition, any signals that must be kept synchronous are also specified. By default, the algorithm assumes that all primary inputs and outputs are synchronous.

A synchronous netlist contains a set of gates that are combinational logic, and another set of gates that are state-holding. The state-holding gates hold the results of a previous cycle of combinational logic during the clock cycle or cycles it serves as inputs to the next combinational logic stage. In this example we consider four types of state-holding gates: positive edge-triggered flip-flops (PFLOPs), negative edge-triggered flip-flops (NFLOPs), latches that are transparent when their clock input is high (PLATCH), and latches that are transparent when their clock input is low (NLATCH). Because synthesis tools can eliminate generated clocks and replace them with combinations of clocks and clock enables, for simplicity we here assume that all clock signals used by state-holding elements are primary clock inputs to the circuit.

The synchronous netlist is converted to an asynchronous format using the synchronous to asynchronous conversion method described in the above-referenced published patent application. This asynchronous implementation is equivalent to the synchronous one in that it performs the same computations or logical functions. This conversion example further includes a method for generating annotations that translate the performance characteristics of the asynchronous implementation back into the synchronous domain using an annotation generator.

The target asynchronous netlist represents circuits that can be implemented efficiently as fine-grained asynchronous pipelines, and can be represented as an asynchronous dataflow graph. Nodes in the dataflow graph operate on data values, referred to as tokens. A token is a data item that can flow through an asynchronous pipeline, and can be a one-bit value or a multi-bit value. Operators in the dataflow graph receive tokens on their inputs and produce tokens on their outputs. The change in the value of the token is used to compute results. Connectivity between operators is specified by arrows that correspond to communication channels along which tokens can be sent and received. Communication channels in this example have no buffering, and sending and receiving a token on a channel corresponds to rendezvous synchronization.

The synchronous to asynchronous conversion algorithm maps a synchronous netlist into an asynchronous dataflow graph that performs the same computation. Each signal is mapped to an edge in the dataflow graph, and the different gates from the synchronous netlist are translated into dataflow operators.

The previously disclosed method is therefore centered around the correspondence between tokens and clock edges. For each clock domain, the value of a signal during clock cycle number k corresponds to the value of the asynchronous data token on the corresponding asynchronous channel that has sequence number k. (In the presence of clock gating, this relationship is slightly more complicated and involves knowing when the clock domain is in fact gated.) In what follows, we refer to asynchronous signals being part of a clock domain when their corresponding synchronous signals were in the specified domain.

In this example, all the signals in the synchronous representation of the circuit originate in some synchronous clock domain. However, it is possible to describe circuits using synchronous description languages like Verilog or VHDL that contain a mixture of synchronous and asynchronous input signals. In particular, a circuit may have an asynchronous input that is not assigned to any clock domain.

Error! Reference source not found. shows an example of a synchronous circuit having a synchronous and asynchronous input, consistent with an example embodiment of the invention. The circuit comprises a clock 101 that drives a gate 102 having an input 103 that is synchronous (because it is the output of a clocked flip flop), and an input 104 that comes from a primary input of the entire circuit. Therefore input 104 need not necessarily be part of any clock domain, unless it is explicitly labeled as being part of some domain. We consider the case when 104 is not a member of any clock domain, and is therefore an asynchronous input to the synchronous circuit. The associated output 105 is now also asynchronous with respect to any clock domain, because it is derived at least in part from an input 104 that is asynchronous.

There are three significant issues to resolve for such a circuit. First, how do we translate an asynchronous input (primary I/O) into a data token that is suitable for interfacing to the other token-based asynchronous representation used for the rest of the synchronous circuit? In particular, we cannot use a clock to sample the input as in the traditional translation methods. Second, how do we convert the input into an asynchronous representation that is suitable for interfacing with the rest of the converted circuit? In particular, we do not have a clock for signal 104 that we can use to guarantee a correspondence between clock edges and data tokens after converting the signal 104 into an asynchronous representation. Third, how do we generate a primary, observable output that is compatible with the original behavior of the synchronous circuit? In particular, we cannot use a clock to sample the output as in the traditional translation.

As the input has no associated clock in the original synchronous representation, the correspondence between clock edges and tokens cannot be used to create tokens in the unclocked asynchronous input. Instead, we introduce a new correspondence, namely a correspondence between changes in the input and data tokens.

Figure 2:
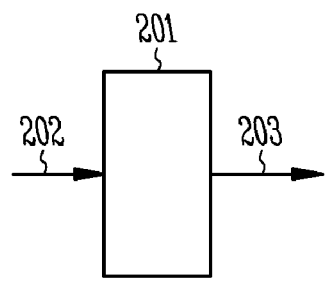
FIG. 2 shows conversion of an asynchronous input into a data token triggered by an asynchronous data input change, consistent with an example embodiment of the invention.
Figure 3:
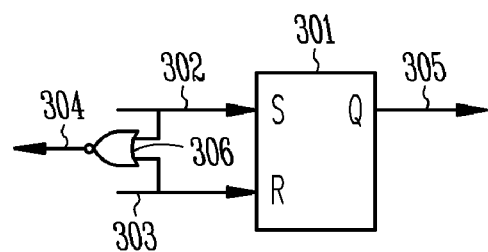
FIG. 3 shows an asynchronous output circuit, consistent with an example embodiment of the invention.

FIG. 2 illustrates a circuit 201 that is used to detect changes in the raw asynchronous signal 202, consistent with an example embodiment of the invention. Whenever the value of signal 202 differs from its previous value, a data token is generated on dataflow channel 203 with the updated value of the signal. Block 201 is essentially therefore an edge detector that triggers token generation. Whenever signal 202 has a rising edge, the block generates a token with value "1" on output 203. Whenever 202 has a falling edge, the block generates a token with value "0" on output 203. There are a variety of circuits that can be used as edge detectors, and it is straightforward to design a circuit that converts edges into tokens.

Some embodiments of the circuit will have an inherent bandwidth limit, as the circuit can only track changes in input signal 202 up to a certain frequency. This limit is determined by the internal handshake cycle time of block 201, and also its interaction with its environment via output 203 as is well-known by those having ordinary skill in the art.

Once we have converted the asynchronous signal into a token-based representation, we can treat the converted signal 203 as being from an unknown clock domain. This can be treated using techniques similar to those used to interface two signals that belong to unrelated clock domains in converting synchronous circuit to asynchronous circuits. For example, when a signal with an unknown clock rate or asynchronous clock is received, tokens for the unknown clock rate input can be generated at the clock rate of other clocked or synchronous inputs in one example. In another example, an asynchronously received token or a token received on a clocked input with an unknown clock rate is held as a token at the input, and processed with synchronous or clocked input tokens once the synchronous or clocked input token is received.

Because prior methods such as those disclosed in the above-referenced pending patent application assumed that each primary output also has an associated clock domain, we could determine precisely when the output should be sampled as well as the appropriate sampling clock for the output signal. However, an asynchronous primary output in the original synchronous circuit can change at arbitrary points in time. To support this functionality, we replicate this behavior in one example embodiment by using a special output converter.

The output converter behaves as follows: whenever an input token arrives, it changes its state to the value just received. The local state of the output converter is then directly connected to the primary output, without any flow control or other synchronization circuitry. The output is therefore asynchronous, changing as soon as the logic operation driving the output is complete, and can be read or sampled by external circuitry at any time.

Error! Reference source not found. illustrates an asynchronous output, consistent with an example embodiment of the invention. The main logic element used to implement this output example is the SR latch 301, which is a standard circuit that is well-known in the art. The output of the SR latch that is labeled "Q" is connected to the primary output signal 305. The inputs to the SR latch arrive from the asynchronous dataflow implementation of the original synchronous circuit. The handshake channel used to implement the dataflow channel consists of the two data signals 302 and 303, and the inverted sense of the acknowledge signal 304 which is referred to as the enable.

Initially both 302 and 303 are low. One of those two signals goes high when a valid data item arrives on the input. Depending on whether 302 or 303 went high, the output of the SR latch is either set or reset, thereby propagating the value of the token to the primary, asynchronous output 305. In parallel, the NOR gate 306 lowers the enable, thereby allowing the input data values 302 and 303 to reset, which then raises the enable once again returning the dataflow channel to the initial state. The timing assumption required is that the time required to reset the input of the SR latch after the enable has gone low is longer than the time required to change the state of the SR latch.

There are a variety of possible implementations of this mechanism, and we have shown one example implementation that can be used to implement one specific dataflow channel protocol. This example utilizes a SR latch to receive data on the set and reset lines 302 and 303 and output the received data, and manage flow of new, incoming data. The NOR gate 306 provides an enable signal that allows the inputs 302 and 303 to reset once data is received on these lines, assuming the SR latch can latch the data faster than the NOR gate changes state and the inputs 302 and 303 can be reset. The asynchronous speed of the circuit is therefore limited only by the speed with which new asynchronous data can be provided in response to the enable signal returning via line 304, and not by synchronization to any specific clock.

The constructs presented above address the problems of creating tokens for asynchronous inputs to synchronous circuits being converted to asynchronous circuits, such as where an interrupt or reset line into a circuit is not clocked. This input with an unknown token rate can interface with the rest of the circuit by creating tokens when ever a changed state is detected, such as is shown in the examples of FIGS. 1 and 2. The resulting asynchronously generated tokens are handled in a similar manner as clocked data with an unknown clock rate, such as matching the token rate of other synchronous inputs.

The constructs also address how to handle outputs generated from data including asynchronous input, as no clock signal drives timing of the resulting asynchronous output. When an asynchronous output receives a token carrying a value update a changed output is provided immediately. For outputs that are not modeled after synchronous outputs, the data is therefore provided as soon as it is available rather than changed based on I/O clock tokens to simulate a clocked logic circuit's output.

Figure 4:
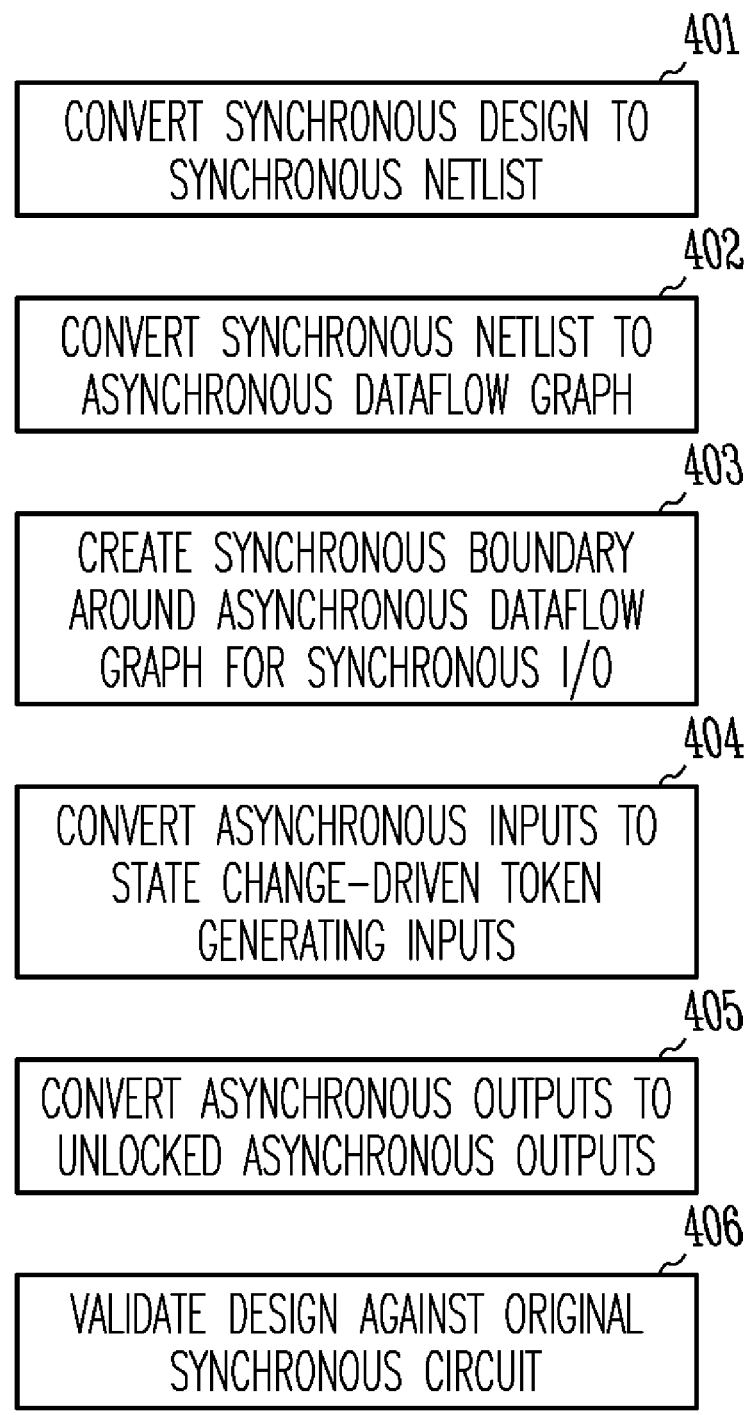
FIG. 4 is a flowchart illustrating a method of converting a synchronous circuit to an asynchronous circuit, consistent with an example embodiment of the invention.

FIG. 4 shows a flowchart of a method of converting a synchronous circuit having asynchronous inputs and outputs to an asynchronous circuit, consistent with an example embodiment of the invention. At 401, a synchronous circuit design is converted to a synchronous netlist. The synchronous netlist is converted to an asynchronous dataflow graph at 402, and a boundary is created around the input/output borders of the synchronous design for the synchronous or clocked inputs and outputs at 403. At 404, the asynchronous inputs are converted asynchronous inputs that generate tokens upon observing a change in state on the asynchronous input, and asynchronous outputs are converted to outputs that are unclocked or asynchronous at 405. At 406, the timing of the asynchronous dataflow graph and boundary inputs and outputs are validated against the requirements of the original synchronous circuit representation.

A software tool that implements methods such as these to convert a synchronous logic circuit having asynchronous inputs and outputs to an asynchronous circuit increases the versatility of asynchronous circuits without requiring that a circuit designer learn asynchronous circuit design techniques or abandon synchronous hardware description languages. A designer can create a circuit having synchronous and asynchronous inputs and outputs, and use asynchronous conversion tools implementing methods such as the examples presented above to create an asynchronous implementation of the synchronous circuit. For example, such a tool can expand the versatility of an asynchronous Field Programmable Gate Array (FPGA) that is used to implement traditional synchronous designs by facilitating handling of asynchronous signals such as interrupts and resets or sampled inputs.

The examples given here illustrate how asynchronous inputs and outputs can be retained in converting a synchronous circuit to an asynchronous circuit, and illustrate how asynchronous inputs and outputs are handled differently from synchronous or clocked inputs and outputs. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A method of converting a synchronous circuit to an asynchronous circuit, comprising:
   converting synchronous circuit logic to an asynchronous circuit logic;
   converting one or more asynchronous inputs at a circuit boundary to an asynchronous input to the converted asynchronous circuit logic, such that the converted asynchronous input is operable to generate a token upon observing a change in state on the asynchronous input; and
   converting an asynchronous output to an asynchronous output operable to update the asynchronous output state upon receipt of a valid data token.

2. A method of converting a synchronous circuit to an asynchronous circuit, comprising:
   converting synchronous circuit logic to an asynchronous circuit logic;
   converting one or more asynchronous inputs at a circuit boundary to an asynchronous input to the converted asynchronous circuit logic, such that the converted asynchronous input is operable to generate a token upon observing a change in state on the asynchronous input; and
   The method of converting a synchronous circuit to an asynchronous circuit of claim 1, further comprising converting one or more synchronous clocked inputs or outputs at circuit boundaries to converted synchronous inputs or outputs having states updated by clock tokens.

3. A method of converting a synchronous circuit to an asynchronous circuit, comprising:
   converting synchronous circuit logic to an asynchronous circuit logic;
   converting one or more asynchronous inputs at a circuit boundary to an asynchronous input to the converted asynchronous circuit logic, such that the converted asynchronous input is operable to generate a token upon observing a change in state on the asynchronous input; and
   wherein converting one or more converted asynchronous circuit inputs having synchronous and asynchronous inputs comprises sampling the asynchronous inputs at the synchronous input clock rate.

4. A method of converting a synchronous circuit to an asynchronous circuit, comprising:
   converting synchronous circuit logic to an asynchronous circuit logic;
   converting one or more asynchronous inputs at a circuit boundary to an asynchronous input to the converted asynchronous circuit logic, such that the converted asynchronous input is operable to generate a token upon observing a change in state on the asynchronous input; and
   validating the converted asynchronous circuit design's timing against the synchronous circuit.

5. A method of converting a synchronous circuit to an asynchronous circuit, comprising:
   converting synchronous circuit logic to an asynchronous circuit logic;
   converting one or more asynchronous outputs at a circuit boundary to an asynchronous output from the converted asynchronous circuit logic, such that the converted asynchronous output is operable to output updated data as soon as changed data is received from the converted asynchronous circuit logic in the asynchronous output; and
   the asynchronous output sending a confirmation of received data to the coupled asynchronous circuit logic.

6. A method of converting a synchronous circuit to an asynchronous circuit, comprising:
   converting synchronous circuit logic to an asynchronous circuit logic;
   converting one or more asynchronous outputs at a circuit boundary to an asynchronous output from the converted asynchronous circuit logic, such that the converted asynchronous output is operable to output updated data as soon as changed data is received from the converted asynchronous circuit logic in the asynchronous output; and
   the asynchronous output sending a confirmation of received data to the coupled asynchronous circuit logic wherein the confirmation comprises lowering an enable line state indicating that an input from the asynchronous circuit logic is received in the asynchronous output.

7. A method of converting a synchronous circuit to an asynchronous circuit, comprising:
converting synchronous circuit logic to an asynchronous circuit logic;
converting one or more asynchronous outputs at a circuit boundary to an asynchronous output from the converted asynchronous circuit logic, such that the converted asynchronous output is operable to output updated data as soon as changed data is received from the converted asynchronous circuit logic in the asynchronous output;
the asynchronous output sending a confirmation of received data to the coupled asynchronous circuit logic wherein the confirmation comprises lowering an enable line state indicating that an input from the asynchronous circuit logic is received in the asynchronous output; and
resetting the asynchronous circuit input provided to the asynchronous output upon observing the enable line in a low state.

8. A method of converting a synchronous circuit to an asynchronous circuit, comprising:
converting synchronous circuit logic to an asynchronous circuit logic;
converting one or more asynchronous outputs at a circuit boundary to an asynchronous output from the converted asynchronous circuit logic, such that the converted asynchronous output is operable to output updated data as soon as changed data is received from the converted asynchronous circuit logic in the asynchronous output; and
the asynchronous output sending a confirmation of received data to the coupled asynchronous circuit logic wherein the asynchronous circuit logic comprises a field programmable gate array.

9. An integrated circuit, comprising
asynchronous circuit logic converted from a synchronous logic circuit; and
one or more asynchronous inputs at a circuit boundary of the converted asynchronous circuit logic, such that the converted asynchronous input is operable to generate a token upon observing a change in state on the asynchronous input;
wherein at least one of the one or more asynchronous inputs comprises an asynchronous circuit input having synchronous and asynchronous inputs that is operable to sample the asynchronous inputs at the synchronous input clock rate.

10. An integrated circuit comprising:
asynchronous circuit logic converted from a synchronous circuit design; and
one or more asynchronous outputs at a circuit boundary of the converted asynchronous circuit logic, such that the converted asynchronous output is operable to output updated data as soon as changed data is received from the converted asynchronous circuit logic in the asynchronous output;
the asynchronous output further operable to send a confirmation of received data to the coupled asynchronous circuit logic comprising lowering an enable line state indicating that an input from the asynchronous circuit logic is received in the asynchronous output.

11. A machine-readable medium with instructions stored thereon, the instructions when executed operable to cause a computerized system to:
convert synchronous circuit logic to an asynchronous circuit logic; and
convert one or more asynchronous inputs at a circuit boundary to an asynchronous input to the converted asynchronous circuit logic, such that the converted asynchronous input is operable to generate a token upon observing a change in state on the asynchronous input;
wherein converting one or more asynchronous inputs comprises converting at least one asynchronous circuit input having synchronous and asynchronous inputs that is operable to sample the asynchronous inputs at the synchronous input clock rate.

12. A machine-readable medium with instructions stored thereon, the instructions when executed operable to cause a computerized system to:
convert synchronous circuit logic to an asynchronous circuit logic; and
convert one or more asynchronous outputs at a circuit boundary to an asynchronous output from the converted asynchronous circuit logic, such that the converted asynchronous output is operable to output updated data as soon as changed data is received from the converted asynchronous circuit logic in the asynchronous output;
wherein converting one or more asynchronous outputs comprises converting at least one asynchronous output to send a confirmation of received data to the coupled asynchronous circuit logic, the confirmation comprising lowering an enable line state indicating that an input from the asynchronous circuit logic is received in the asynchronous output.

\* \* \* \* \*

UNITED STATES PATENT AND TRADEMARK OFFICE
CERTIFICATE OF CORRECTION

PATENT NO.        : 7,982,502 B2                          Page 1 of 1
APPLICATION NO.   : 12/559573
DATED             : July 19, 2011
INVENTOR(S)       : Rajit Manohar et al.

It is certified that error appears in the above-identified patent and that said Letters Patent is hereby corrected as shown below:

In column 8, lines 11-12, in Claim 2, below "and" delete "The method of converting a synchronous circuit to an asynchronous circuit of claim 1, further comprising".

Signed and Sealed this

Eighteenth Day of October, 2011

David J. Kappos
*Director of the United States Patent and Trademark Office*